United States Patent
Wu

(10) Patent No.: US 9,869,723 B2
(45) Date of Patent: Jan. 16, 2018

(54) POWER MANAGEMENT SCHEME FOR SEPARATELY AND ACCURATELY MEASURING BATTERY INFORMATION OF EACH OF MULTIPLE BATTERIES

(71) Applicant: MEDIATEK INC., Hsin-Chu (TW)

(72) Inventor: Jui-Chi Wu, Taichung (TW)

(73) Assignee: MEDIATEK INC., Hsin-Chu (TW)

( * ) Notice: Subject to any disclaimer, the term of this patent is extended or adjusted under 35 U.S.C. 154(b) by 111 days.

(21) Appl. No.: 14/715,611

(22) Filed: May 19, 2015

(65) Prior Publication Data
US 2015/0338466 A1 Nov. 26, 2015

Related U.S. Application Data

(60) Provisional application No. 62/001,648, filed on May 22, 2014.

(51) Int. Cl.
*H02J 7/00* (2006.01)
*G01R 31/36* (2006.01)

(52) U.S. Cl.
CPC ..... *G01R 31/3606* (2013.01); *G01R 31/3648* (2013.01); *G01R 31/3662* (2013.01); *H02J 7/0021* (2013.01); *H02J 7/0014* (2013.01); *H02J 2007/004* (2013.01)

(58) Field of Classification Search
CPC ............ G01R 31/3606; G01R 31/3662; G01R 31/3648; G01R 31/3637; G01R 31/3658; H02J 7/0021; H02J 1/00; H02J 2007/004; H02J 2007/0037; H02J 7/0008; H02J 7/0081; H02J 7/0014; H01M 2220/30
See application file for complete search history.

(56) References Cited

U.S. PATENT DOCUMENTS

| 6,232,750 | B1 * | 5/2001 | Podrazhansky | ....... H02J 7/0093 320/139 |
| 6,445,162 | B1 * | 9/2002 | Mukainakano | ...... G01R 31/362 320/132 |
| 6,563,318 | B2 * | 5/2003 | Kawakami | ......... G01R 31/3679 320/132 |

(Continued)

FOREIGN PATENT DOCUMENTS

| CN | 101860049 A | 10/2010 |
| CN | 102222957 A | 10/2011 |
| CN | 103091637 A | 5/2013 |

OTHER PUBLICATIONS

"A method for accurately predicting remaining battery capacity of a portable device and its corresponding operation time", Docin.com, Dec. 24, 2011, http://www.docin.com/p-313769556.html.

(Continued)

*Primary Examiner* — Helen Rossoshek
(74) *Attorney, Agent, or Firm* — Winston Hsu

(57) ABSTRACT

A power management apparatus used in a system comprising multiple batteries includes an ADC measurement circuit and a processing circuit. The ADC measurement circuit is configured for measuring or detecting a plurality of voltage levels for each of the multiple batteries. The processing circuit is configured for calculating a DC current for each of the batteries according to an internal resistance of each of the batteries and the detected voltage levels, and for estimating an internal voltage level for each of the batteries according to the calculated DC current.

16 Claims, 3 Drawing Sheets

(56) References Cited

U.S. PATENT DOCUMENTS

| | | | | |
|---|---|---|---|---|
| 6,768,288 B2* | 7/2004 | Rosenquist | G01R 31/3624 | 320/132 |
| 6,842,708 B2* | 1/2005 | Odaohhara | G06F 1/28 | 702/57 |
| 7,091,698 B2* | 8/2006 | Yamazaki | G01R 31/3679 | 320/132 |
| 7,218,078 B2* | 5/2007 | Gagnon | G01R 31/3655 | 320/132 |
| 7,388,383 B2* | 6/2008 | Kawakami | G01R 31/3662 | 324/430 |
| 7,633,265 B2* | 12/2009 | Matsushima | H02J 7/00 | 320/133 |
| 8,421,416 B2* | 4/2013 | Hsu | H02J 7/0072 | 320/132 |
| 8,547,066 B2* | 10/2013 | Bieler | H02J 7/0013 | 320/112 |
| 2003/0090239 A1* | 5/2003 | Sakakibara | H02J 7/0042 | 320/166 |
| 2007/0001680 A1* | 1/2007 | Khoo | G01R 31/3655 | 324/430 |
| 2011/0060538 A1* | 3/2011 | Fahimi | G01R 31/3679 | 702/63 |
| 2011/0077879 A1* | 3/2011 | Paryani | G01R 31/3662 | 702/63 |
| 2011/0175576 A1* | 7/2011 | Uesaka | H01M 10/44 | 320/155 |
| 2011/0187329 A1* | 8/2011 | Majima | G01R 31/36 | 320/149 |
| 2011/0234167 A1* | 9/2011 | Kao | G01R 31/361 | 320/132 |
| 2012/0091966 A1* | 4/2012 | Mori | H01M 10/44 | 320/134 |
| 2013/0080096 A1* | 3/2013 | Toki | G01R 31/3624 | 702/63 |
| 2014/0009123 A1* | 1/2014 | Park | G01R 31/361 | 320/152 |
| 2014/0184166 A1* | 7/2014 | Ohkawa | H01M 10/441 | 320/134 |
| 2015/0165921 A1* | 6/2015 | Paryani | G01R 31/3662 | 320/109 |
| 2015/0349547 A1* | 12/2015 | Jeon | H02J 7/00 | 320/134 |
| 2016/0238663 A1* | 8/2016 | Wu | G01R 31/3651 | |

OTHER PUBLICATIONS

Li, Fang-pei et al., "Battery Internal Resistance Measurement using AC impendent Method", Journal of Chongqing Institute of Technology (Natural Science), vol. 23 No. 9, Sep. 2009, pp. 93-98.

* cited by examiner

POWER MANAGEMENT SCHEME FOR SEPARATELY AND ACCURATELY MEASURING BATTERY INFORMATION OF EACH OF MULTIPLE BATTERIES

CROSS REFERENCE TO RELATED APPLICATIONS

This application claims the benefit of U.S. Provisional Application No. 62/001,648, which was filed on May 22, 2014.

BACKGROUND

The invention relates to a power management scheme, and more particularly to a power management apparatus used in a system comprising multiple batteries and corresponding power management method.

Generally speaking, for a system comprising a single battery, a conventional gauge circuit is provided and used with the single battery for measuring state of charge and/or remaining capacity of this single battery. However, in a system comprising multiple batteries, the conventional gauge circuit cannot separately measure state of charge and/or remaining capacity of each battery. Actually, the gauge circuit can be only used to measure the state and/or capacity of a primary battery (i.e. a main battery), and the states and/or capacities of other batteries are to be estimated by using another look-up table scheme. Unfortunately, the look-up table scheme cannot accurately estimate the states or capacities of other batteries. The error rate made by the estimation of the look-up table scheme usually falls within a range from thirty percent to fifty percent, and it becomes not acceptable for the system to execute more accurate operations based on the estimation result. Accordingly, it is important to provide a novel scheme for separately and more accurately measuring states and/or capacities of multiple batteries for the system.

SUMMARY

It is therefore one of the objectives of the invention to provide a power management apparatus and method for separately and more accurately measuring states and/or capacities of multiple batteries for a system.

According to one embodiment of the invention, a power management apparatus used in a system comprising multiple batteries is disclosed. The power management apparatus comprises an ADC measurement circuit and a processing circuit. The ADC measurement circuit is configured for measuring or detecting a plurality of voltage levels for each of the multiple batteries. The processing circuit is coupled to the ADC measurement circuit and configured for calculating a DC current for each of the batteries according to an internal resistance of each of the batteries and the detected voltage levels, and for estimating an internal voltage level for each of the batteries according to the calculated DC current.

According to one embodiment of the invention, a power management method used in a system comprising multiple batteries is further disclosed. The power management method comprises: providing and using a single ADC measurement circuit to measure or detect a plurality of voltage levels for each of the multiple batteries; calculating a DC current for each of the batteries according to an internal resistance of each of the batteries and the detected voltage levels; and estimating an internal voltage level for each of the batteries according to the calculated DC current.

According to the embodiments of the invention, in a system comprising multiple batteries, only a single ADC measurement circuit is needed to separately and more accurately measure information of DC current/resistance for each battery. This provides a low cost and high accuracy solution.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
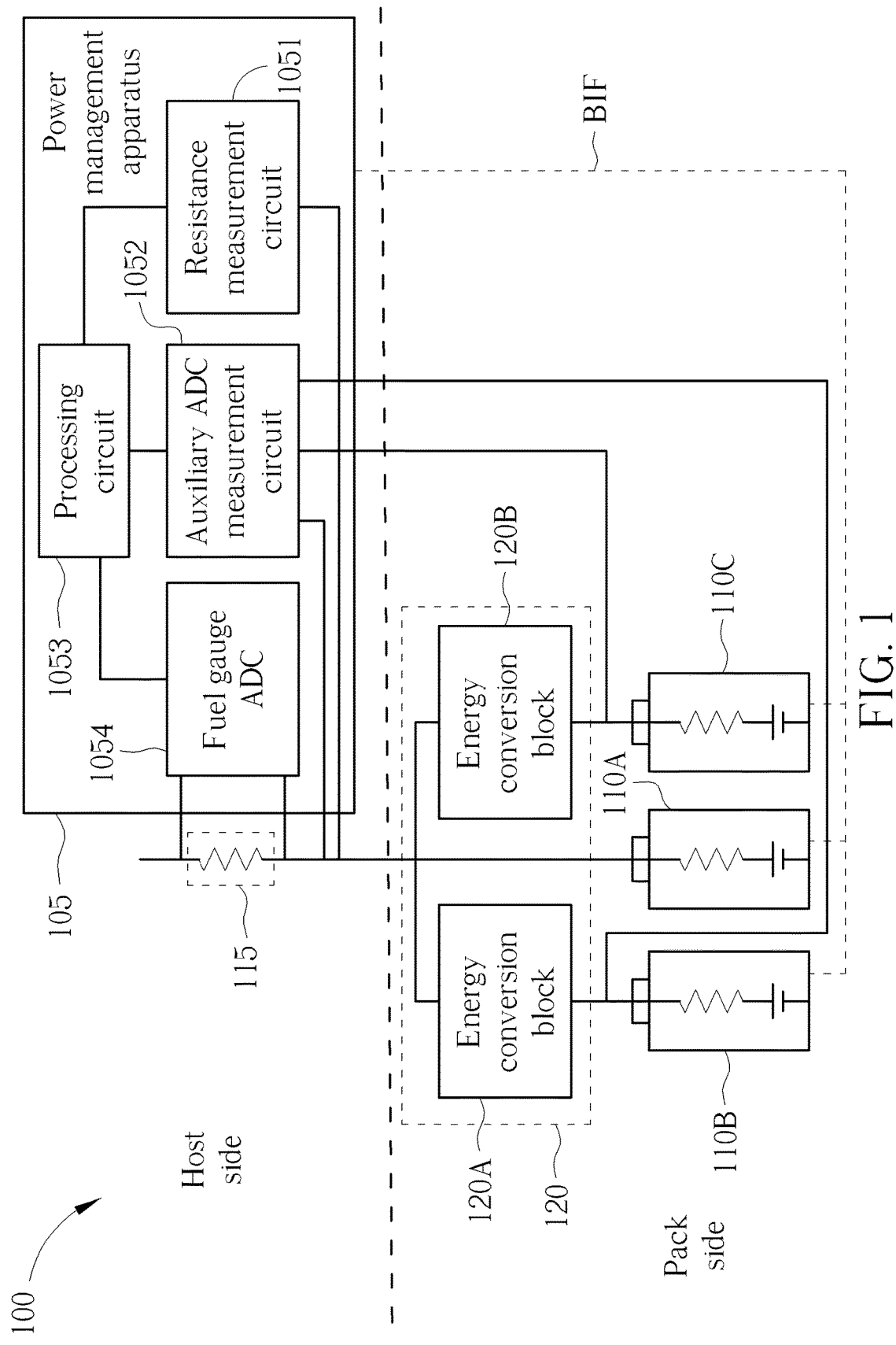
FIG. 1 is a diagram of a power management apparatus used in a system comprising multiple batteries according to a first embodiment of the invention.

Please refer to FIG. 1, which is a diagram of a power management apparatus 105 used in a system 100 comprising multiple batteries according to a first embodiment of the invention. For example, the system 100 runs on a portable device such as a smart phone device and/or a tablet device. The multiple batteries are used for providing power for the portable device and may be configured to be included within the same battery pack or maybe not. In this embodiment, the multiple batteries for example comprise batteries 110A, 110B, 110C wherein one is a main battery and the others are secondary batteries. However, this is not intended to be a limitation of the invention. In another embodiment, the multiple batteries may comprise the other number of batteries. The power management apparatus 105 is configured at a host side of the system 100. That is, the power management apparatus 105 is configured within the portable device. For example, the power management apparatus 105 may be a battery protection device configured at the side of the portable device. In addition, it should be noted that the operations of the power management apparatus 105 can be used to detect and estimate information of each batteries 110A-110C precisely and respectively and then send the information to the system 100 so that the system 100 can obtain or estimate the state (state of charge or/and remaining capacity) of each batteries 110A-110C precisely. In order to simplify space of the description, in this example the power management apparatus 105 is arranged to detect and estimate the state of battery 110A; however, this is not intended to be a limitation of the invention. The power management apparatus 105 can also detect and estimate information of battery 110B and the state of battery 110C separately. In addition, the traditional method of open-circuit voltage look-up table is not required. The precision of measurement for the state of battery can be effectively improved.

In addition, it should be also noted that the power management apparatus 105 can be used to detect or estimate the direct-current (DC) current and/or alternating-current (AC) current of a battery such as 110A wherein the DC current usually means an averagely maximum current that can be provided by the battery 110A to the system 100 and the AC current usually means an immediately maximum current that can be provided by the battery 110A to the system 100. In addition, the power management apparatus 105 can be used to detect the internal voltage of each battery and the minimum system voltage level that can be provided from the battery 110A to the system 100, and send the information of the internal voltage and the minimum voltage to the system 100. Accordingly, after obtaining the AC current, DC current, and/or the above-mentioned voltages, the system 100 can dynamically adjust its behavior.

In practice, the power management apparatus 105 comprises a resistance measurement circuit 1051, an auxiliary ADC measurement circuit 1052, a processing circuit 1053, and a fuel gauge ADC circuit 1054. For each of the batteries 110A, 110B, and 110C, initially the resistance measurement circuit 1051 is used for measuring an internal resistance for one battery. The auxiliary ADC measurement circuit 1052 is coupled to the resistance measurement circuit 1051, and is used for measuring or detecting a plurality of voltage levels for the battery at different timings after the internal resistance of the battery has been measured. The auxiliary ADC measurement circuit 1052 may measure the external battery voltage twice according to the internal resistance of the battery to obtain two external battery voltages. Also, the auxiliary ADC measurement circuit 1052 is arranged to periodically measure the voltage levels based on the internal resistance in order to calculate/estimate the DC current provided from the battery. For example, the auxiliary ADC measurement circuit 1052 may measure the external battery voltage every tenth seconds; however, this is not meant to be a limitation of the invention. The estimated two external battery voltages are transmitted to the processing circuit 1053, and the processing circuit 1053 can derive the DC current provided by the battery according to the internal resistance and a voltage difference between the estimated two external battery voltages. After calculating the DC current, the processing circuit 1053 can execute a software program to implement Coulomb counting scheme and estimate an open-loop voltage of the battery by using the Coulomb counting scheme with an impedance tracking scheme. By doing so, the power management apparatus 105 is able to more precisely estimate the state of charge and/or remaining capacity of the battery. Since the auxiliary ADC measurement circuit 1052 can be used for measuring or detecting a plurality of voltage levels for each battery (110A-110C) at different timings, only a single auxiliary ADC measurement circuit is needed. Accordingly, additional circuit costs can be saved by employing the auxiliary ADC measurement circuit 1052. Compared to a traditional scheme using open-circuit voltage look-up table, a precision of the estimation made by the power management apparatus 105 is higher than that of the traditional scheme. For example, an error rate of the estimation made by the traditional scheme would be from thirty percent to fifty percent. However, an error rate of the estimation made by the power management apparatus 105 is significantly reduced down to merely ten percent.

Further, the resistance measurement circuit 1051 is optional. In other embodiments, the resistance measurement circuit 1051 may be excluded from the power management apparatus 105. In the embodiments, the internal resistance of each battery can be estimated by using another circuit that is externally to the power management apparatus 105. After receiving the internal resistance from this external circuit, the processing circuit 1053 can still calculate/estimate the DC current for each battery according to the received internal resistance and the detected voltage levels, and then estimate the open-loop voltage of each battery by using the Coulomb counting scheme with the impedance tracking scheme, so as to obtain the state of charge and/or remaining capacity of each battery.

In addition, for measuring AC resistance of each battery, the fuel gauge ADC circuit 1054 is employed. The fuel gauge ADC circuit 1054 is coupled to the processing circuit 1053 and externally connected to a sensing resistor 115 that is included within the portable device but is not included within the power management apparatus 105. For measuring the AC resistance of each battery, the fuel gauge ADC circuit 1054 extracts a loading current immediately from each battery at different timings or the same timing and then detects or obtains a voltage drop across the sensing resistor for each battery according to the extracted loading current and the resistance of the sensing resistor. The fuel gauge ADC circuit 1054 then calculates the AC resistance for each battery according to the loading current and the voltage drop. The fuel gauge ADC circuit 1054 can be arranged to detect the total resistance of the multiple batteries 110A-110C and the maximum current that can be extracted from the multiple batteries 110A-110C.

In practice, the processing circuit 1053 may trigger or execute a software program/application to control the fuel gauge ADC circuit 1054 to measure the AC resistance of each battery 110A-110C, so as to achieve impedance tracking. For each battery 110A-110C, the fuel gauge ADC circuit 1054 is arranged to measure a first set of voltage and current for one battery. Then, the processing circuit 1053 may enable at least one of a dummy load, a normal load, and a charging operation, and may generate a current pulse change on the battery. The fuel gauge ADC circuit 1054 is arranged to measure a second set of voltage and current for the battery. The processing circuit 1053 calculates the AC resistance for the battery according to the first set of current and voltage and the second set of current and voltage. By enabling/using the dummy load and/or normal load, the processing circuit 1053 can instantly generate the current pulse change for the system 100 operating on the portable device by discharging the battery with a specific current. In another example, by enabling the charging operation for the battery, the processing circuit 1053 can also instantly generate the current pulse change for the system 100. The power management apparatus 105 can create current variation by using the dummy load, normal load (normal system task power consumption), and/or by adjusting a charger current. Based on the first set of voltage and current and second set of voltage and current, the power management apparatus 105 can derive/calculate or measure the AC resistance for this battery. In accordance with the measured AC resistance, the power management apparatus 105 can derive or calculate the averagely maximum current level, the immediately maximum current level, and/or the minimum system voltage level that can be provided to the system 100.

In addition, as shown in FIG. 1, the multiple batteries 110A, 110B, 110C are connected in parallel, and an energy conversion circuit 120 including two energy conversion blocks 120A and 120B is employed. One energy conversion block is connected between any two batteries. The energy conversion block (e.g. 120A) is used for appropriately/dynamically converting voltage level and transferring energy of one battery to another when the voltage levels of the two batteries are different. In addition, the energy conversion block (e.g. 120A) may dynamically connect or disconnect the two batteries. In practice, one energy conversion block can be implemented by using one of a switch, a current limit circuit, and an On-The-Go (OTG) charger. The energy conversion circuit 120 may comprise a switch unit configured for dynamically connecting or disconnecting two batteries, and the switch unit is controlled by the processing circuit 1053. The energy conversion circuit 120 may comprise a current limit circuit configured for dynamically limiting a current flowing from one of two batteries to the other, and the current limit circuit is controlled by the processing circuit 1053. The energy conversion circuit 120 may comprise a charging circuit configured for dynamically charging or boosting one of two batteries by using energy of the other, and the charging circuit is controlled by the processing circuit 1053.

In addition, in another embodiment, the multiple batteries may be connected in series. Please refer to FIG. 2, which is a diagram of the power management apparatus 105 used in a system 200 comprising multiple batteries 210A and 210B according to a second embodiment of the invention. For each of the batteries 210A and 210B, its positive and negative plates are connected to two ends of a switch unit. For example, the positive and negative plates of battery 210A are connected to the switch unit 215A, and the positive and negative plates of battery 210B are connected to the switch unit 215B. When the switch unit 215A is closed, the power management apparatus 105 is arranged for detecting the voltage levels of battery 210B. Instead, when the switch unit 215B is closed, the power management apparatus 105 is arranged for detecting the voltage levels of battery 210A. The statuses of switch units 210A and 210B are controlled by the power management apparatus 105.

Figure 2:
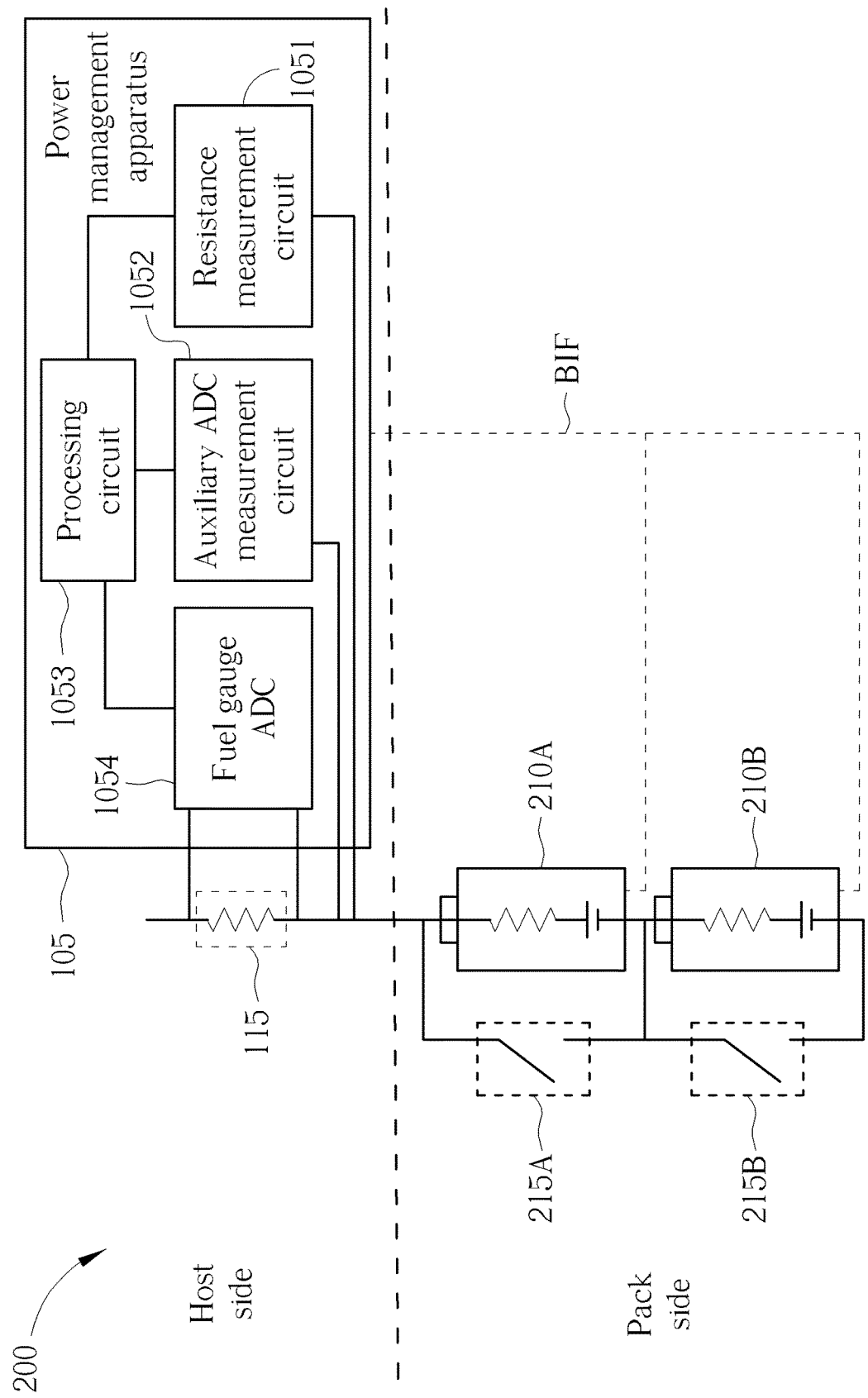
FIG. 2 is a diagram of a power management apparatus used in a system comprising multiple batteries according to a second embodiment of the invention.

In addition, in order to avoid the inherent limitations of fuel gauge at the host side, a battery protection circuit can be employed and configured at the pack side. For example, battery protection circuits are configured within a battery pack including the above-mentioned multiple batteries 110A-110C. Please refer to FIG. 1 again. As shown in FIG. 1, the power management apparatus 105 can communicate with each battery 110A-110C via the MIPI BIF interface (shown by dotted line). This shows that each battery 110A-110C corresponds to one battery protection circuit (not shown in FIG. 1), and the power management apparatus 105 communicates with these battery protection circuits respectively via the MIPI BIF (Mobile Industry Processor Interface Battery Interface) interface. The power management apparatus 105 at the host side can transfer or write information associated with the state of charge, remaining capacity, internal resistance, AC current, DC current, and other information to the battery protection circuits. The battery protection circuits are arranged to store these information and check whether any of batteries 110A-110C is removed/replaced or not by comparing the information previously received with information currently retrieved from batteries that are currently positioned at the pack side. In addition, via the interface of MIPI BIF, the power management apparatus 105 at the host side can read information of control data, battery percentage, aging factors, battery cycle, and battery capacity from the battery protection circuits. In addition, if one battery is removed and replaced by a new and different battery, the power management apparatus 105 can write information from the portable device into the battery protection circuits, to update the information mentioned above. The information of battery percentage is correct and is not lost, and thus this can avoid the problem of battery percentage change when the system 100 reboots or an old battery has been replaced by a new battery. In addition, by doing this, the power management apparatus 105 can be aware of that an old battery has been replaced by a new battery. Further, since the power management apparatus 105 for calculating the information to be stored in the battery protection circuits is disposed at the side of portable device 510, total circuit costs can be significantly reduced. Similarly, as shown in FIG. 2, the power management apparatus 105 can communicate with each battery 210A-210B via the MIPI BIF interface (shown by dotted line). This shows that each battery 210A-210B corresponds to one battery protection circuit (not shown in FIG. 2), and the power management apparatus 105 communicates with these battery protection circuits respectively via the MIPI BIF interface. Accordingly, the power management apparatus 105 can also effectively check whether any of batteries 210A-210B is removed/replaced or not.

Furthermore, in other embodiments, each battery (e.g. 110A-110C) may respectively correspond to different battery protection circuits rather than the same circuit. The power management apparatus 105 can still read battery information from each battery protection circuit at the pack side and/or write battery information into battery protection circuit via separate connecting interfaces such as MIPI BIF interfaces.

Figure 3:
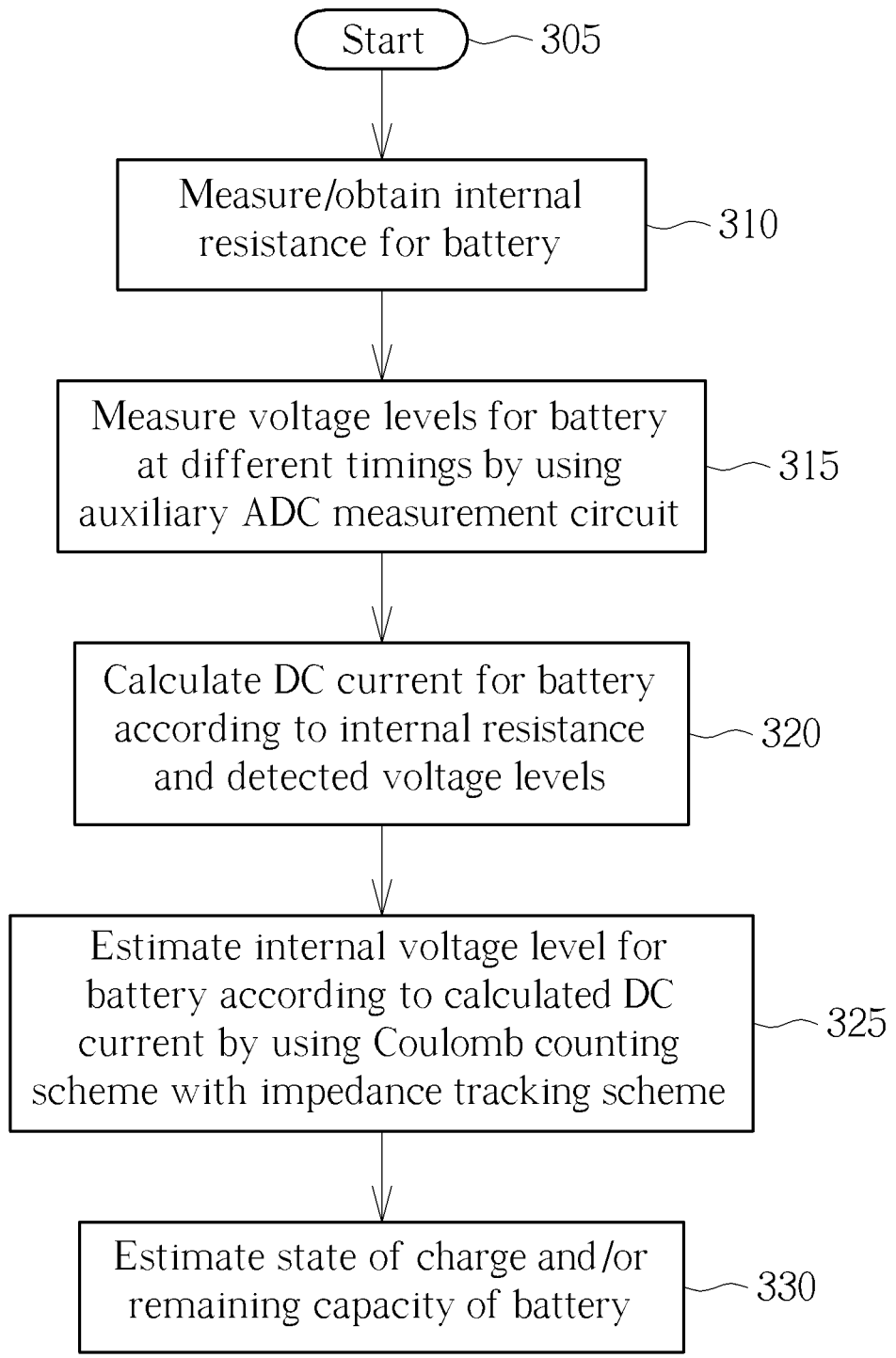
FIG. 3 is a flowchart according to the operations of power management apparatus as shown in FIG. 1 and FIG. 2.

To make readers clearly understand the operations mentioned above, FIG. 3 is provided and illustrates a flowchart according to the operations of power management apparatus 105 as shown in FIG. 1 and FIG. 2. Provided that substantially the same result is achieved, the steps of the flowchart shown in FIG. 3 need not be in the exact order shown and need not be contiguous, that is, other steps can be intermediate. The steps are described in the following:

Step 305: Start;

Step 310: Measure/obtain an internal resistance for one battery and/or each battery;

Step 315: Measure or detect voltage levels for the battery and/or each battery at different timings by using the auxiliary ADC measurement circuit 1052;

Step 320: Calculate a DC current for the battery and/or each battery by using the processing circuit 1053 according to the internal resistance and the detected voltage levels;

Step 325: Estimate an internal voltage level for the battery and/or each battery according to the calculated DC current by using Coulomb counting scheme with the impedance tracking scheme; and Step 330: Estimate the state of charge and/or remaining capacity of the battery and/or each battery.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power management apparatus used in a system comprising multiple batteries, comprising:
   an ADC measurement circuit, configured for measuring or detecting a plurality of external voltage levels at different timings for each of the multiple batteries, the plurality of external voltage levels being external battery voltages of each of the multiple batteries measured at the different timings; and
   a processing circuit, coupled to the ADC measurement circuit, configured for performing following operations for each of the batteries: calculating a DC current of each of the batteries according to the detected external voltage levels and an internal resistance of each of the batteries initially measured by a resistance measurement circuit, and for estimating an internal voltage level of each of the batteries according to the calculated DC current when the DC current has been calculated based on the internal resistance of each of the batteries and the detected external voltage levels.

2. The power management apparatus of claim 1, further comprising:
a resistance measurement circuit, coupled to the processing circuit, configured for measuring the internal resistance of each of the batteries and sending information of the internal resistance to the processing circuit.

3. The power management apparatus of claim 1, further comprising:
a fuel gauge ADC circuit, coupled to the multiple batteries and a sensing resistor that is externally connected to the power management apparatus, configured for extracting a loading current immediately from each of the batteries, obtaining a voltage drop according to the loading current and a resistance of the sensing resistor, and calculating an AC internal resistance for each of the batteries according to the loading current and the voltage drop.

4. The power management apparatus of claim 1, wherein the multiple batteries comprise a first battery and a second battery connected in parallel, and an energy conversion circuit is coupled between the first and second batteries and configured for providing energy conversion between the first and second batteries.

5. The power management apparatus of claim 4, wherein the energy conversion circuit comprises a switch unit configured for dynamically connecting or disconnecting the first and second batteries, and the switch unit is controlled by the processing circuit.

6. The power management apparatus of claim 4, wherein the energy conversion circuit comprises a current limit circuit configured for limiting a current flowing from one of the first and second batteries to the other, and the current limit circuit is controlled by the processing circuit.

7. The power management apparatus of claim 4, wherein the energy conversion circuit comprises a charging circuit configured for charging or boosting one of the first and second batteries by using energy of the other, and the charging circuit is controlled by the processing circuit.

8. The power management apparatus of claim 1, wherein the multiple batteries comprise a first battery and a second battery connected in series.

9. The power management apparatus of claim 1 is configured within a portable device connected to the multiple batteries included within a same battery pack.

10. A power management method used in a system comprising multiple batteries, comprising:
providing and using a single ADC measurement circuit to measure or detect a plurality of external voltage levels at different timings for each of the multiple batteries, the plurality of external voltage levels being external battery voltages of each of the multiple batteries measured at the different timings; and for each of the batteries:
calculating a DC current of each of the batteries according to the detected external voltage levels and an internal resistance of each of the batteries initially measured by a resistance measurement circuit; and
estimating an internal voltage level of each of the batteries according to the calculated DC current when the DC current has been calculated based on the internal resistance of each of the batteries and the detected external voltage levels.

11. The power management method of claim 10, further comprising:
measuring the internal resistance of each of the batteries.

12. The power management method of claim 10, further comprising:
using a fuel gauge ADC circuit to extract a loading current immediately from each of the batteries;
obtaining a voltage drop according to the loading current and a resistance of an external sensing resistor; and
calculating an AC internal resistance for each of the batteries according to the loading current and the voltage drop.

13. The power management method of claim 10, wherein the multiple batteries comprise a first battery and a second battery connected in parallel, and the power management method further comprises:
providing energy conversion and transfer between the multiple batteries.

14. The power management method of claim 13, further comprising:
dynamically connecting or disconnecting the multiple batteries.

15. The power management method of claim 13, further comprising:
dynamically limiting a current flowing from one of the multiple batteries to another battery.

16. The power management method of claim 13, further comprising:
dynamically charging or boosting one of the multiple batteries by using energy of another battery.

* * * * *